(12) United States Patent
Kishioka et al.

(10) Patent No.: US 12,339,586 B2
(45) Date of Patent: Jun. 24, 2025

(54) PHOTOCURABLE RESIN COMPOSITION CONTAINING SELF-CROSSLINKABLE POLYMER

(71) Applicant: NISSAN CHEMICAL CORPORATION, Tokyo (JP)

(72) Inventors: Takahiro Kishioka, Toyama (JP); Shunsuke Moriya, Toyama (JP)

(73) Assignee: NISSAN CHEMICAL CORPORATION, Tokyo (JP)

(*) Notice: Subject to any disclaimer, the term of this patent is extended or adjusted under 35 U.S.C. 154(b) by 0 days.

(21) Appl. No.: 18/835,123

(22) PCT Filed: Feb. 21, 2023

(86) PCT No.: PCT/JP2023/006222
§ 371 (c)(1),
(2) Date: Aug. 1, 2024

(87) PCT Pub. No.: WO2023/162968
PCT Pub. Date: Aug. 31, 2023

(65) Prior Publication Data
US 2025/0116936 A1    Apr. 10, 2025

(30) Foreign Application Priority Data
Feb. 22, 2022 (JP) .................... 2022-025403

(51) Int. Cl.
| | | |
|---|---|---|
| G03F 7/09 | (2006.01) | |
| C09D 125/14 | (2006.01) | |
| C09D 133/14 | (2006.01) | |
| G03F 7/00 | (2006.01) | |
| G03F 7/42 | (2006.01) | |
| H01L 21/027 | (2006.01) | |

(52) U.S. Cl.
CPC .......... *G03F 7/09* (2013.01); *C09D 125/14* (2013.01); *C09D 133/14* (2013.01); *G03F 7/422* (2013.01); *G03F 7/70008* (2013.01); *H01L 21/0271* (2013.01)

(58) Field of Classification Search
CPC ........ G03F 7/09; G03F 7/422; G03F 7/70008; C09D 125/14; C09D 133/14; H01L 21/0271
USPC ......... 438/694; 430/311, 270.1, 271.1, 272.1
See application file for complete search history.

(56) References Cited

U.S. PATENT DOCUMENTS

| | | |
|---|---|---|
| 2005/0064108 A1 | 3/2005 | Kano et al. |
| 2006/0199108 A1 | 9/2006 | Kim et al. |
| 2011/0256685 A1 | 10/2011 | Suzuki et al. |
| 2012/0302041 A1 | 11/2012 | Maeda et al. |
| 2020/0319561 A1 | 10/2020 | Endo et al. |
| 2021/0074538 A1 | 3/2021 | Zi et al. |
| 2022/0275250 A1 | 9/2022 | Asai et al. |
| 2024/0087905 A1* | 3/2024 | Kobayashi ............ C08L 61/04 |

FOREIGN PATENT DOCUMENTS

| | | |
|---|---|---|
| CN | 111492312 A | 8/2020 |
| JP | 2005-101554 A | 4/2005 |
| JP | 2011-228340 A | 11/2011 |
| JP | 2017-098333 A | 6/2017 |
| JP | 2020-531643 A | 11/2020 |
| WO | 2021/024862 A1 | 2/2021 |

OTHER PUBLICATIONS

Substrate Processing Method, WO2020012777 (Year: 2020).*
Apr. 25, 2023 International Search Report issued in International Patent Application No. PCT/JP2023/006222.
Sep. 6, 2024 International Preliminary Report on Patentability issued in International Patent Application No. PCT/JP2023/006222.
May 7, 2024 Office Action issued in Japanese Patent Application No. 2023-567875.
Apr. 14, 2025 Extended Search Report issued in European Patent Application No. 23759969.1.
Apr. 15, 2025 Office Action issued in Chinese Patent Application No. 202380022676.8.

\* cited by examiner

*Primary Examiner* — Caleen O Sullivan
(74) *Attorney, Agent, or Firm* — Oliff PLC

(57) ABSTRACT

A photocurable composition including: a self-crosslinking polymer including a first monomer unit including an aryl ketone residue in a side chain, and a second monomer unit including in a side chain an aliphatic hydrocarbon residue including a carbon atom susceptible to a hydrogen abstraction reaction and/or an aromatic ring residue; and a solvent. Also, a method for manufacturing a semiconductor device including the steps of forming a resist film on a semiconductor substrate, forming a resist pattern by irradiating the resist film with light or an electron beam and then developing the resist film, and processing the semiconductor substrate by etching, the method further including a step of forming a protective film from the photocurable composition on the front edge and optionally the bevel and/or the back edge of a wafer for manufacturing a semiconductor.

12 Claims, No Drawings

PHOTOCURABLE RESIN COMPOSITION CONTAINING SELF-CROSSLINKABLE POLYMER

TECHNICAL FIELD

The present invention relates to a photocurable resin composition containing a crosslinkable polymer, and a protective film for a substrate (wafer) edge surface for manufacturing a semiconductor, a protective film-forming composition for forming the protective film, a wafer for manufacturing a semiconductor manufactured using the protective film, and methods for manufacturing the wafer for manufacturing a semiconductor and a semiconductor device in a semiconductor device manufacturing process.

BACKGROUND ART

In manufacturing a semiconductor device, a method for applying a chemical solution containing a metal to a wafer has been studied for the purpose of, for example, improving an etching selection ratio with complication of a manufacturing process. Furthermore, for example, since a resolution of a resist pattern in a case of performing exposure using extreme ultraviolet (EUV) is increased and high etching resistance is exhibited, it has been studied to form a resist film using a resist containing an inorganic metal. Adhesion of the metal to a non-targeted portion of the wafer in the manufacturing process of the semiconductor device greatly affects the electrical characteristics of the semiconductor device. However, in forming a coating film containing a metal as mentioned above, the chemical solution supplied to a front surface of the wafer flows from a peripheral edge surface to the vicinity of a peripheral edge of a back surface of the wafer, and the coating film is formed even to an unintentional peripheral edge surface and back surface peripheral edge, such that there is a concern that these portions are metal-contaminated. Then, when the contaminated portion of such a wafer comes into contact with a processing device of the wafer such as an exposure device or an etching device or with a conveyance mechanism of the wafer, the wafers that are consecutively conveyed and processed following the contaminated wafer processed through the processing device or conveyance mechanism may also be metal-contaminated, that is, cross-contamination may occur.

In order to solve such a problem, a technique capable of forming a coating film so that a peripheral edge surface, which is a peripheral edge of a substrate, and a back surface peripheral edge are not in contact with the coating film by forming a protective film at least on the peripheral edge surface, which is a peripheral edge of the substrate, and the back surface peripheral edge, when the coating film is formed on a front surface of the substrate is disclosed (Patent Literature 1). In addition, a method for manufacturing a semiconductor device in which peeling of a film from a bevel portion of a substrate is suppressed by providing a simple additional process (forming a second mask to cover a first mask on the bevel portion so that the first mask on the bevel portion does not collapse) is disclosed (Patent Literature 2).

However, a film material functioning as a protective film at the edge of the substrate is required to have a high etching resistance, and further improvement is desired.

CITATION LIST

Patent Literature

Patent Literature 1: JP 2017-098333 A
Patent Literature 2: JP 2011-228340 A

SUMMARY OF INVENTION

Technical Problem

Therefore, an object of the present invention is to provide a resin material capable of forming a protective film having sufficient etching resistance required for protecting an edge of a substrate (wafer) for manufacturing a semiconductor in manufacturing a semiconductor device.

Another object of the present invention is to provide a protective film capable of completely covering an edge of a substrate (wafer) for manufacturing a semiconductor by a simple method by application, a protective film-forming composition for forming the protective film, a wafer for manufacturing a semiconductor manufactured using the protective film, and methods for manufacturing the wafer for manufacturing a semiconductor and a semiconductor device in manufacturing a semiconductor device.

Solution to Problem

The present invention encompasses the following.
[1] a Photocurable Resin Composition Containing:
  a self-crosslinkable polymer (A) containing:
    (a) a first monomer unit containing an aryl ketone residue in a side chain; and
    (b) a second monomer unit containing, in a side chain,
      (b-1) an aliphatic hydrocarbon residue containing a carbon atom susceptible to a hydrogen abstraction reaction, and/or
      (b-2) an aromatic ring residue; and a solvent (B).
[1-1]
The photocurable resin composition according to [1], wherein the self-crosslinkable polymer (A) contains a second monomer unit containing:
  (b-1) an aliphatic hydrocarbon residue containing a carbon atom susceptible to a hydrogen abstraction reaction, and
  (b-2) an aromatic ring residue.
[2]
The photocurable resin composition according to [1], further comprising a crosslinkable polymer or crosslinkable compound (C) different from the self-crosslinkable polymer (A).
[3]
The photocurable resin composition according to [2], wherein the crosslinkable polymer or crosslinkable compound (C) has a crosslinkable group selected from the group consisting of an epoxy group, a (meth)acrylic group, a vinyl group, a carboxylic acid group, a thiol group, a silanol group, a cinnamoyl group, and a hydroxy group.
[4]
The photocurable resin composition according to any one of [1] to [3], wherein the photocurable resin composition has a viscosity of 100 cps or less at 25° C.
[5]
A wafer edge protective film-forming composition for manufacturing a semiconductor, which comprises the photocurable resin composition according to any one of [1] to [4].

[6]
A protective film, which is a cured product of a coating film of the wafer edge protective film-forming composition for manufacturing a semiconductor according to [5].
[7]
The protective film according to [6], wherein the protective film has a thickness of 1 to 500 nm.
[8]
The protective film according to [6] or [7], in which the protective film is used for preventing metal contamination of a wafer edge.
[9]
The protective film according to any one of [6] to [8], wherein the protective film has been cured by a light having a wavelength of 170 to 800 nm.
[10]
A wafer for manufacturing a semiconductor with a wafer edge protected, formed by applying the wafer edge protective film-forming composition for manufacturing a semiconductor according to [5] to an edge of a wafer precursor.
[11]
A method for manufacturing a semiconductor device, the method comprising:
(A) forming a resist film on a semiconductor substrate;
(B) forming a resist pattern by irradiation of the resist film with a light or electron beam and subsequent development; and
(C) processing the semiconductor substrate by etching, wherein the method includes step (X) of forming a protective film of the wafer edge protective film-forming composition for manufacturing a semiconductor according to [5] on a front surface edge and optionally on a bevel portion and/or back surface edge of a wafer for manufacturing a semiconductor.
[12]
The method for manufacturing a semiconductor device according to [11], wherein the method includes step (X) before step (A).
[13]
The method for manufacturing a semiconductor device according to [11], wherein the method includes step (X) between step (A) and step (B).
[14]
The method for manufacturing a semiconductor device according to [11], wherein the method includes step (X) after step (B) or after step (C).
[15]
The method for manufacturing a semiconductor device according to any one of [11] to [14], wherein the method includes, after step (X), step (Y) of removing the resist film formed on the protective film.
[16]
The method for manufacturing a semiconductor device according to any one of [11] to [14], wherein the method includes, after step (X), step (Z) of removing the protective film.
[17]
The method for manufacturing a semiconductor device according to [15], wherein the method includes, after step (Y), step (Z) of removing the protective film.
[18]
The method for manufacturing a semiconductor device according to any one of [11] to [17], wherein the resist film contains a metal.
[19]
The method for manufacturing a semiconductor device according to any one of [11] to [18], wherein step (X) includes the step of conducting application of the wafer edge protective film-forming composition for manufacturing a semiconductor according to [5], followed by exposure and development on a predetermined region.
[20]
The method for manufacturing a semiconductor device according to [16] or [17], wherein step (Z) is performed by ashing or by a treatment with hydrofluoric acid, an organic solvent, an alkaline developer, or a semiconductor cleaning solution.
[21]
A method for manufacturing a wafer for manufacturing a semiconductor, the method comprising the step of:
applying the wafer edge protective film-forming composition for manufacturing a semiconductor according to [5] to an edge of a wafer precursor to make a wafer having the protected edge.
[22]
The photocurable resin composition according to any one of [1] to [4], wherein the aryl ketone residue is a residue of an aryl ketone selected from the group consisting of acetophenone, benzophenone, anthraquinone, anthrone, a heteroatom-substituted anthrone analog of the following structural formula:

[Chem. 1]

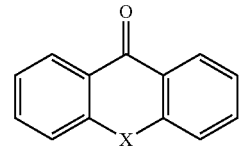

and a substituted derivative thereof,
wherein X is O, S, or N—R, and R is a hydrogen atom, a hydrocarbon group, or an acyl group.
[23]
The photocurable resin composition according to any one of [1] to [4], wherein the carbon atom susceptible to a hydrogen abstraction reaction in hydrocarbon chain (b-1) is selected from the group consisting of a tertiary carbon atom; a secondary carbon atom; and a methyl group, a methylene group, or a methine group directly bonded to an aromatic ring.
[24]
The photocurable resin composition according to any one of [1] to [4], wherein aromatic ring (b-2) is an optionally substituted aromatic ring having 6 to 40 carbon atoms.
[25]
The photocurable resin composition according to any one of [1] to [4], wherein a ratio of the number of repetitions of a first monomer unit to the number of repetitions of a monomer unit including a second monomer unit different from the first monomer unit is selected so that, when a film having a thickness of 300 nm is formed, a transmittance of the film at a wavelength of 300 nm is 0.01% or more, preferably 0.1% or more, and more preferably 1% or more.
[26]
A self-crosslinkable polymer (A) comprising:
(a) a first monomer unit containing an aryl ketone residue in a side chain; and
(b) a second monomer unit containing, in a side chain,
(b-1) an aliphatic hydrocarbon residue containing a carbon atom susceptible to a hydrogen abstraction reaction, and/or
(b-2) an aromatic ring residue.

Advantageous Effects of Invention

By a photocurable resin composition according to one embodiment of the present invention, a protective film having a sufficient etching resistance, and particularly, a wafer edge protective film for manufacturing a semiconductor can be formed without using a polymerization initiator.

In addition, in manufacturing a semiconductor device according to one embodiment of the present invention, it is possible to prevent cross contamination due to metal contamination in a subsequent semiconductor device manufacturing process using a protective film capable of completely covering an edge of a substrate (wafer) for manufacturing a semiconductor by a simple method by application, and it is possible to improve a yield of a high-quality semiconductor manufacturing device.

DESCRIPTION OF EMBODIMENTS

<1. Photocurable resin composition [1]/wafer edge protective film-forming composition for manufacturing semiconductor [5]>

(1-1)

A photocurable resin composition according to one embodiment of the present invention contains a self-crosslinkable polymer (A) and a solvent (B).

The photocurable resin composition may further contain a crosslinkable polymer or crosslinkable compound (C) different from the self-crosslinkable polymer (A).

In addition, the photocurable resin composition may be preferably used as a protective film-forming composition (a wafer front edge protective film-forming composition for manufacturing a semiconductor, hereinafter, may be abbreviated as a "protective film-forming composition") used for protecting a front surface edge of a wafer for manufacturing a semiconductor.

[1-2: Self-crosslinkable polymer (A)]

(1-2-1)

A self-crosslinkable polymer (A) is a polymer containing:
(a) a first monomer unit containing an aryl ketone residue in a side chain; and
(b) a second monomer unit containing, in a side chain,
  (b-1) an aliphatic hydrocarbon residue containing a carbon atom susceptible to a hydrogen abstraction reaction, and/or
  (b-2) an aromatic ring residue.

The self-crosslinkable polymer may optionally contain a monomer unit different from the first and second monomer units as long as the advantageous effects of the present invention are not impaired.

(1-2-2) First monomer unit (1-2-2-1)

The aryl ketone residue in the first monomer unit is referred to a residue of a compound (monoaryl ketone or diaryl ketone) in which one or two aryl groups are directly bonded to a carbonyl group [—C(=O)—], and the aryl ketone residue acts as a photoreactive group, and can cause a crosslinking reaction upon activation by a light having a specific wavelength such as ultraviolet rays.

Note that, in the present specification, a "residue" of a certain compound is used as an organic group, in which a hydrogen atom bonded to a carbon atom or a heteroatom (a nitrogen, oxygen, or sulfur atom, or the like) constituting the compound is replaced with a bond for a covalent bond.

The aryl ketone residue constitutes a side chain of the self-crosslinkable polymer through an appropriate linking group, for example, an ester bond or an amide bond, in the side chain of the self-crosslinkable polymer according to one embodiment of the present invention.

Note that, in the present specification, the term "side chain" broadly includes a chemical group covalently bonded to a main chain and hanging laterally, and is used synonymously with a so-called pendant group.

Specific examples of the aryl ketone residue include a residue of an aryl ketone selected from the group consisting of acetophenone, benzophenone, anthraquinone, anthrone, a heteroatom-substituted anthrone analog of the following structural formula:

[Chem. 2]

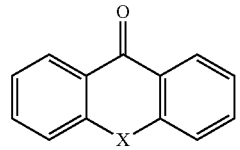

and a substituted derivative thereof, wherein X is O, S, or N—R, and R is a hydrogen atom, a hydrocarbon group (preferably having 1 to 4 carbon atoms), or an acyl group (preferably having 1 to 4 carbon atoms).

A substituent such as a hydroxy group, an amino group, or a carboxyl group is present on the aromatic ring of the aryl ketone residue, or a covalent bond such as an ester bond (—O—CO— or —CO—O—), an amide bond (—NH—CO— or —CO—NH—), a urethane bond (—NH—CO—O— or —O—CO—NH—), a carbonic acid ester bond (—O—CO—O—), or a urea bond (—NH—CO—NH—) is formed between X of a nitrogen atom-substituted anthrone analog (X=NH) and a functional group such as a carboxyl group, a hydroxy group, or an amino group of the polymer constituting the main chain, such that the side chain of the self-crosslinkable polymer is constituted.

Two covalent bonds such as an ester bond (—O—CO— or —CO—O—), an amide bond (—NH—CO— or —CO—NH—), a urethane bond (—NH—CO—O— or —O—CO—NH—), a carbonic acid ester bond (—O—CO—O—), and a urea bond (—NH—CO—NH—) may be combined, and the two covalent bonds may be linked by a divalent linking group L, for example, a hydrocarbon chain in which the chain may be interrupted by a heteroatom (an oxygen atom or the like). Examples thereof include —CO—O—L—O—CO—, —CO—NH—L—NH—CO—, and the like.

(1-2-2-2)

Of these aryl ketone residues, a residue of benzophenone or a substituted derivative thereof (hereinafter, referred to as a "benzophenone compound") is preferable from the viewpoint that the lifetime of the lowest excited triplet is relatively long and the photochemical reaction is susceptible to occur.

Examples of the benzophenone compound include 2,2'-dihydroxy-4-methoxybenzophenone, disodium
2,2'-dihydroxy-4,4'-dimethoxydisulfobenzophenone,
2,2'-dihydroxy-4,4'-dimethoxybenzophenone, 2,2',3,4-tetrahydroxybenzophenone,
2,2',4,4'-tetrahydroxybenzophenone, 2,2'3,4,4'-pentahydroxybenzophenone,
2,2'-dihydroxy-4-methoxybenzophenone, 2,3,3'4,4',5'-hexahydroxybenzophenone, 2,3,4,4'-tetrahydroxybenzophenone, 2,3,4-trihydroxybenzophenone,
2,4,4'-trihydroxybenzophenone, 2,4,5-trihydroxybenzophenone,
2,4,6-trihydroxybenzophenone, 2,4-dihydroxy-4'-diethylaminobenzophenone,
2,4-dihydroxy-4'-dimethylaminobenzophenone, 2,4-dihydroxybenzophenone, 4,4'-dihydroxybenzophenone,
2-hydroxy-4-(2-hydroxy-3-methacryloxy)propoxybenzophenone,
2-hydroxy-4'-dimethylaminobenzophenone, 2-hydroxy-4-i-octyloxybenzophenone,
2-hydroxy-4-n-octyloxybenzophenone, 2-hydroxy-4-octyloxybenzophenone,
2-hydroxy-4-acetoxyethoxybenzophenone, 2-hydroxy-4-octadecyloxybenzophenone,
2-hydroxy-4-dodecyloxybenzophenone,
2-hydroxy-4-methoxy-2'-carboxybenzophenone,
2-hydroxy-4-methoxy-5-sulfobenzophenone, 2-hydroxy-4-methoxybenzophenone,
2-hydroxybenzophenone, 4,4'-dihydroxybenzophenone,
4,4'-bis(diethylamino)benzophenone, 4,4'-bis(dimethylamino)benzophenone,
4',6-dihydroxy-2-naphthobenzophenone, 4-dodecyloxy-2-hydroxybenzophenone,
4-hydroxybenzophenone, and N,N,N,N'-tetramethyl-4,4'-diaminobenzophenone.

Examples of the benzophenone compound also include optionally substituted vinylbenzophenone.

In addition, examples of the structure capable of abstracting a hydrogen radical by ultraviolet irradiation include a benzyl group, an o-benzoylbenzoic acid ester group, a thioxanthone group, a 3-ketocoumarin group, a 2-ethylanthraquinone group, and a camphorquinone group. A compound having any of the structures may be used as a compound from which the first monomer unit is derived.

(1-2-2-3)

The monomer constituting the main chain moiety of the first monomer unit may be any polymerizable monomer containing an aryl ketone residue and a functional group (such as a carboxyl group, a hydroxy group, or an amino group) that can form a covalent bond such as an ester bond (—O—CO— or —CO—O—), an amide bond (—NH—CO— or —CO—NH—), a urethane bond (—NH—CO—O— or —O—CO—NH—), a carbonic acid ester bond (—O—CO—O—), or a urea bond (—NH—CO—NH—).

(1-2-2-4)

Specific examples of the first monomer unit that may be preferably used include the following units, when the residue of a benzophenone compound is taken as the aryl ketone residue. That is, the first monomer unit is benzophenone, 4-acryloyloxyethoxy-4'-bromobenzophenone, 4-methacryloyloxybenzophenone,
4-methacryloyloxyethoxybenzophenone, 4-methacryloyloxy-4'-methoxybenzophenone,
4-methacryloyloxyethoxy-4'-methoxybenzophenone,
4-methacryloyloxy-4'-bromobenzophenone,
4-methacryloyloxyethoxy-4'-bromobenzophenone, or the like.

(1-2-3) Second monomer unit (1-2-3-1)

The aliphatic hydrocarbon residue containing a carbon atom susceptible to a hydrogen abstraction reaction, which is referred to in the second monomer unit refers to an aliphatic hydrocarbon residue (preferably a monovalent hydrocarbon residue) containing a carbon atom that causes a hydrogen abstraction reaction by a photochemical reaction caused by an aryl ketone residue in a side chain and contributes to a crosslinking reaction. For example, the aliphatic hydrocarbon residue is an aliphatic hydrocarbon chain containing a carbon atom selected from a tertiary carbon atom; a secondary carbon, and preferably a secondary carbon atom having a hydroxy group; a methyl group, a methylene group, or a methine group directly bonded to an unsaturated organic group (an aromatic ring, an ethylene group, or the like); and a methylene group or a methine group directly bonded to a hydroxy group oxygen atom. The aliphatic hydrocarbon residue may be optionally substituted with a substituent such as a hydroxy group, an alkoxy group, or an aryl group.

The aliphatic hydrocarbon residue referred to herein may be substituted with an aromatic ring so that a reaction of abstraction of a hydrogen atom bonded to a carbon atom in the residue is susceptible to occur, or is interpreted that a chain of the aliphatic hydrocarbon residue may be inserted and interrupted (for example, —R—Ar—R in the case R is an aliphatic hydrocarbon chain and Ar is an aromatic ring, or the like) by an aromatic ring in the middle.

The aliphatic hydrocarbon residue in the side chain may be directly covalently bonded to the main chain, and may form a side chain with a functional group such as a carboxyl group, a hydroxy group, or an amino group of the polymer constituting the main chain therebetween through a covalent bond such as an ester bond (—O—CO— or —CO—O—), an amide bond (—NH—CO— or —CO—NH—), a urethane bond (—NH—CO—O— or —O—CO—NH—), a carbonic acid ester bond (—O—CO—O—), or a urea bond (—NH—CO—NH—).

Two of covalent bonds such as an ester bond (—O—CO— or —CO—O—), an amide bond (—NH—CO— or —CO—NH—), a urethane bond (—NH—CO—O— or —O—CO—NH—), a carbonic acid ester bond (—O—CO—O—), and a urea bond (—NH—CO—NH—) may be combined, and the two covalent bonds may be linked by a divalent linking group L, for example, a hydrocarbon chain, in which the chain may be interrupted by a heteroatom (an oxygen atom or the like). Examples thereof include —CO—O—L—O—CO—, —CO—NH—L—NH—CO—, and the like.

The number of carbon atoms of the aliphatic hydrocarbon residue is preferably 1 to 18.

In addition, from the viewpoint of improving adhesiveness to a coating surface of the self-crosslinkable polymer, a hydrophilic substituent such as a hydroxy group is preferably bonded to a carbon atom susceptible to a hydrogen abstraction reaction. Examples thereof include —CH(OH)—, and preferred examples of the aliphatic hydrocarbon residue containing a carbon atom include $CH_3CH(OH)CH_2$—.

(1-2-3-2)

Specific examples of the second monomer containing an aliphatic hydrocarbon residue in the side chain are as follows. That is, they include:
as alkyl (meth)acrylate, an acrylate monomer having a branched or cyclic alkyl chain having 1 to 22 carbon atoms, such as a 2-ethylhexyl (meth)acrylate, isobutyl (meth)acrylate, cyclohexyl (meth)acrylate, isobornyl (meth)acrylate, or dicyclopentanyl (meth)acrylate monomer; or
a hydroxy group-containing monomer such as 2-hydroxyethyl (meth)acrylate, 2-hydroxypropyl (meth)acrylate, 3-hydroxypropyl (meth)acrylate, 2-hydroxybutyl (meth)acrylate, 4-hydroxybutyl (meth)acrylate, 1,4-cyclohexanedimethanol mono(meth)acrylate, 1-glycerol (meth)acrylate, 2-hydroxyethyl (meth)acrylamide, N-hydroxypropyl (meth)acrylamide, or allyl alcohol.

(1-2-3-3)

The aromatic ring residue referred to in the second monomer unit may be any one that would cause a hydrogen abstraction reaction by a photochemical reaction caused by an aryl ketone residue in a side chain and contribute to a crosslinking reaction, but is different from the side chain of the first monomer unit containing the aryl ketone residue described above.

More specifically, examples thereof include an optionally substituted residue having an aromatic ring structure having 6 to 40 carbon atoms, and specific examples thereof include benzene, naphthalene, anthracene, acenaphthene, fluorene, triphenylene, phenalene, phenanthrene, indene, indane, indacene, pyrene, chrysene, perylene, naphthacene, pentacene, coronene, heptacene, benzo[a]anthracene, dibenzophenanthrene, and dibenzo[a,j]anthracene.

The aromatic ring residue may optionally have a substituent, and examples of the substituent for some or all hydrogen atoms present in the aromatic ring structure having 6 to 40 carbon atoms include a hydroxy group, a halogen atom, a carboxyl group, a nitro group, a cyano group, a methylenedioxy group, an acetoxy group, a methylthio group, an amino group, or an alkoxy group having 1 to 9 carbon atoms.

Examples of the alkoxy group having 1 to 9 carbon atoms include a methoxy group, an ethoxy group, an n-propoxy group, an i-propoxy group, an n-butoxy group, an i-butoxy group, an s-butoxy group, a t-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, a 1-ethyl-2-methyl-n-propoxy group, an n-heptyloxy group, an n-octyloxy group, and an n-nonyloxy group.

(1-2-3-4)

The monomer constituting the main chain moiety of the second monomer unit may be any polymerizable monomer containing an aliphatic hydrocarbon residue containing a carbon atom susceptible to a hydrogen abstraction reaction, or an aromatic ring residue, and a functional group (such as a carboxyl group, a hydroxy group, or an amino group) that can form a covalent bond, such as an ester bond (—O—CO— or —CO—O—), an amide bond (—NH—CO— or —CO—NH—), a urethane bond (—NH—CO—O— or —O—CO—NH—), a carbonic acid ester bond (—O—CO—O—), or a urea bond (—NH—CO—NH—). As a specific example, in addition to a vinyl monomer such as styrene, the main chain moiety of the exemplary monomer (1-2-3-2) may be referred to.

Here, the aliphatic hydrocarbon residue may form a covalent bond with a functional group (a carboxyl group, a hydroxy group, an amino group, or the like) of a monomer constituting a main chain moiety as an aliphatic hydrocarbon moiety constituting a functional group such as an alkoxy group or an alkylamino group.

In addition, in the aromatic ring residue, a substituent such as a hydroxy group, an amino group, or a carboxyl group may be present on the aromatic ring, and the substituent may form a covalent bond with a functional group such as a carboxyl group, a hydroxy group, or an amino group of the polymer constituting the main chain.

These covalent bonds include an ester bond (—O—CO— or —CO—O—), an amide bond (—NH—CO— or —CO—NH—), a urethane bond (—NH—CO—O— or —O—CO—NH—), a carbonic acid ester bond (—O—CO—O—), a urea bond (—NH—CO—NH—), and the like.

In addition, two covalent bonds such as an ester bond (—O—CO— or —CO—O—), an amide bond (—NH—CO— or —CO—NH—), a urethane bond (—NH—CO—O— or —O—CO—NH—), a carbonic acid ester bond (—O—CO—O—), and a urea bond (—NH—CO—NH—) may be combined, and the two covalent bonds may be linked by a divalent linking group L, for example, a hydrocarbon chain, in which the chain may be interrupted by a heteroatom (an oxygen atom or the like). Examples thereof include —CO—O—L—O—CO—, —CO—NH—L—NH—CO—, and the like.

(1-2-3-5)

The second monomer unit undergoes a photochemical reaction caused by the aryl ketone residue of the first monomer unit, and is cured by crosslinking. Here, the term "self-crosslinking" means that curing may be performed by a crosslinking reaction without requiring addition of a polymerization initiator.

A ratio of the number of repetitions of the first monomer unit to the number of repetitions of the second monomer unit may be determined in consideration of a thickness of a film to be formed by photocuring of the self-crosslinkable polymer and a light absorbability by the aryl ketone residue. This is because it is required to examine a ratio of the first monomer unit, which is a measure of a degree of light absorption, and a film thickness corresponding to a distance for allowing the light to reach, in order to sufficiently reach the bottom of the film to be formed with the light for curing.

The ratio of the number of repetitions of the first monomer unit to the number of repetitions of the monomer unit different from the first monomer unit (including the second monomer unit) may be determined by adjusting the number of repetitions of the first monomer unit so that, when a film having a thickness of 300 nm is formed, a transmittance of the film at a wavelength of 300 nm is 0.01% or more, preferably 0.1% or more, and more preferably 1% or more.

(1-2-3-6)

When an additional monomer unit different from the first and second monomers is contained in the self-crosslinkable polymer, the (1-2-3-5) above is applied by replacing the ratio with a ratio of the number of repetitions of the first monomer unit to the number of repetitions of the monomer unit including the second monomer unit different from the first monomer unit.

(1-2-3-7)

The self-crosslinkable polymer according to one embodiment of the present invention contains, as a monomer unit, a first monomer unit containing an aryl ketone residue in a side chain, and thus may be self-crosslinked without adding a polymerization initiator, and the oxygen atom content is reduced; thus, etching resistance may be improved.

(1-3: Solvent (B))

Examples of the solvent contained in the photocurable resin composition according to one embodiment of the present invention include water, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, 7-butyrolactone, N-methylpyrrolidone, N,N-dimethylformamide, and N,N-dimethylacetamide. These solvents may be used each alone or in combination of two or more thereof.

The solvent may be added so that the photocurable resin composition according to one embodiment of the present invention has an appropriate viscosity. In general, it is preferable that the solvent is contained in an amount of about 100 to 3,000 parts by mass relative to 100 parts by mass of the total amount of the self-crosslinkable polymer (A) and the optionally contained crosslinkable polymer or compound (C).

(1-4: Crosslinkable polymer or crosslinkable compound (C))

(1-4-1)

The photocurable resin composition according to one embodiment of the present invention may further contain a crosslinkable polymer or crosslinkable compound (C).

The crosslinkable polymer or crosslinkable compound (C) refers to a polymer or compound having a crosslinkable group and a crosslinkable polymer different from the self-crosslinkable polymer (A).

Here, the crosslinkable group means a group capable of forming a crosslinked structure by an action of light, an electron beam, other electromagnetic waves, a radical, an acid, heat, water, oxygen, or the like. Examples thereof include, but are not limited to, an epoxy group, an acrylic group, a vinyl group, a carboxylic acid group, a thiol group, a silanol group, a cinnamoyl group, and a hydroxy group (including a phenolic hydroxy group).

Examples of the crosslinkable polymer or crosslinkable compound (C) include, but are not limited to, the following:

epoxy (meth)acrylate;

cinnamic acid-grafted epoxy novolac;

phenoplast, which is a thermosetting material obtained by polycondensation of phenol and aldehyde with removal of water and formation of a three-dimensional network;

for example, a melamine resin such as trimethylolmelamine or hexamethylolmelamine, a urea-based resin such as dimethylol propylene urea, dimethylol ethylene urea, or dimethylol hydroxyurea, and an aminoblast resin such as a dimethylol uron resin;

a (blocked) isocyanate;

vinyl ether;

a polysiloxane resin having a (meth)acrylic group; and an epoxy resin.

(1-4-2)

The crosslinkable polymer or crosslinkable compound (C) may be a crosslinkable compound having at least one partial structure and preferably at least two partial structures selected from Partial Structures (I) represented by the following Formulas (1-1) to (1-7) described in WO 2018/190380 A:

[Chem. 3]

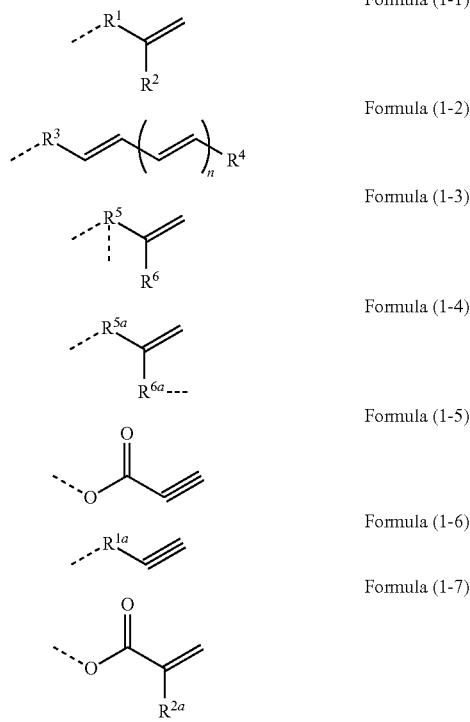

(in the formulas, $R^1$, $R^2$, $R^3$, $R^{5a}$, and $R^{6a}$ each independently represent an alkylene group having 1 to 10 carbon atoms, an arylene group having 6 to 40 carbon atoms (the alkylene group and the arylene group may be optionally substituted with one or two or more amide groups or amino groups), an oxygen atom, a carbonyl group, a sulfur atom, —C(O)—$NR^a$—, —$NR^b$—, or a divalent group consisting of a combination thereof, $R^5$ each independently represent a nitrogen atom, or a trivalent group consisting of a combination of a nitrogen atom and at least one group selected from the group consisting of an alkylene group having 1 to 10 carbon atoms, an arylene group having 6 to 40 carbon atoms (the alkylene group and the arylene group may be optionally substituted with one or two or more amide groups or amino groups), an oxygen atom, a carbonyl group, a sulfur atom, —C(O)—$NR^a$—, and —$NR^b$—, $R^2$, $R^{2a}$, $R^4$, and $R^6$ each independently represent a hydrogen atom, an alkyl group having 1 to 10 carbon atoms, or a monovalent group consisting of a combination of a hydrogen atom and at least one group selected from the group consisting of an alkylene group having 1 to 10 carbon atoms, an oxygen atom, a carbonyl group, a sulfur atom, —C(O)—$NR^a$—, and —$NR^b$—, $R^a$ represents a hydrogen atom or an alkyl group having 1 to 10 carbon atoms, $R^b$ represents a hydrogen atom, an alkyl group having 1 to 10 carbon atoms, or an alkylcarbonyl group having 1 to 10 carbon atoms, n represents the number of repeating units of 1 to 10, and a dotted line represents a chemical bond to an adjacent atom).

The entire disclosure of WO 2018/190380 A is incorporated into the present application by reference.

(1-4-3)

The crosslinkable polymer or crosslinkable compound (C) may be a combination described in JP 2016-003160 A of a polyfunctional epoxy (meth)acrylate compound and a polyfunctional thiol compound.

Such a combination may be preferably crosslinked with a radical polymerization initiator.

A molecular weight of the polyfunctional epoxy (meth)acrylate compound may be within the range of 300 to 20,000.

The polyfunctional epoxy (meth)acrylate compound may be a bisphenol-type polyfunctional epoxy (meth)acrylate compound.

The polyfunctional thiol compound may be a liquid at 25° C.

In addition to the above combination, a polymerization inhibitor may be contained.

The entire disclosure of JP 2016-003160 A is incorporated into the present application by reference.

(1-4-4)

The crosslinkable polymer or crosslinkable compound (C) may be a photopolymerizable substance described in WO 2009/104643 A.

The photopolymerizable substance may be a compound having at least one cationically polymerizable reactive group or a compound having at least one radically polymerizable reactive group.

The photopolymerizable compound may be a sugar compound.

The sugar compound may be a monosaccharide or disaccharide compound.

The sugar compound may be represented by Formula (10):

[Chem. 4]

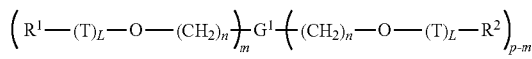

Formula (10)

(wherein $G^1$ represents a sugar skeleton, T represents a divalent linking group, $R^1$ represents a vinyl group or a glycidyl group, $R^2$ represents a hydrogen atom or a hydroxy group, n and L each represent an integer of 0 or 1, p is an integer and is the total number of hydroxy groups of the sugar, and m is an integer satisfying $1 \leq m \leq (p-m)$, and preferably $2 \leq m \leq (p-m)$).

The photopolymerizable compound may be an alicyclic epoxy compound or an alicyclic oxetane compound.

The alicyclic epoxy compound may be a cycloalkylene oxide derivative.

The alicyclic epoxy compound may be represented by Formula (2) or Formula (3):

[Chem. 5]

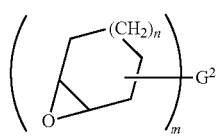

Formula (2)

-continued

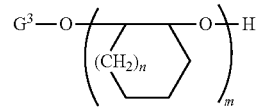

Formula (3)

(wherein $G^2$ represents an alkylene group, a carbonyloxy group, a heterocyclic ring, an aromatic ring, or a monovalent to pentavalent linking group having a combination thereof, $G^3$ represents an alkyl group, an alkylcarbonyl group, a heterocyclic ring, an aromatic ring, or an organic group having a combination thereof, n and m each represent an integer of 1 to 5, and m preferably represents an integer of 2 to 5).

The entire disclosure of WO 2009/104643 A is incorporated into the present application by reference.

(1-5: Resin composition)

A method for preparing a photocurable resin composition is not particularly limited. That is, the self-crosslinkable polymer (A), the solvent (B), the optional crosslinkable polymer or crosslinkable compound (C), and the other components may be mixed in an arbitrary ratio and in an arbitrary order to form a uniform solution. Preferably, the thus-prepared photocurable resin composition in a solution state is filtered with a filter having a pore size of about 0.2 μm or the like before use.

When a cured film having a thickness of about 300 nm is produced by a rotary coating method, the photocurable resin composition preferably has a viscosity of about 100 cps or less at 25° C. Note that, in the present invention, the viscosity is a value measured by an E-type viscometer.

(1-6: Protective film-forming composition)

The photocurable resin composition according to one embodiment of the present invention has excellent etching resistance, and thus may be preferably used as a protective film-forming composition (a wafer edge protective film-forming composition for manufacturing a semiconductor, hereinafter, may be abbreviated as a "protective film-forming composition") used for protecting a front surface edge of a wafer for manufacturing a semiconductor.

As the properties of the protective film covering the edge of the substrate (wafer) for manufacturing a semiconductor, in addition to the above-mentioned function of preventing metal contamination, it is desirable to satisfy dry etching resistance, phosphoric acid resistance, tetramethylammonium hydroxide (TMAH) resistance, HF removability, scratch resistance, excellent embeddability in a stepped substrate, a low sublimation amount, affinity to a hydrophobic substrate, leaving no crater foreign substance or the like on the side surface of the wafer, an excellent edge shape, a function of suppressing inner humps (a phenomenon in which a film-forming composition remains in a bump shape immediately below an injection hole of a nozzle), and the like.

In addition, the protective film-forming composition according to one embodiment of the present invention is photosensitive. For example, the protective film-forming composition is a negative solvent-developing type. The photosensitive protective film-forming composition (negative type) is applied to the front surface edge and optionally the bevel portion and/or back surface edge of the substrate, and then a portion where a film is to be cured is exposed and developed, such that the bevel portion may be accurately covered with the protective film. Due to the photosensitivity, it is possible to easily control the film thickness of the protective film on the edge surface of the wafer, which is advantageous in that the inner humps can be removed, the edge shape can be improved, and a deviation of the center position at the time of rotary coating can be corrected.

(1-7: Polysiloxane)

(1-7-1)

The photocurable resin composition according to one embodiment of the present invention may optionally contain a polysiloxane. The polysiloxane may be a modified polysiloxane in which a part of silanol groups is modified, for example, a polysiloxane modified product in which a part of silanol groups is alcohol-modified or acetal-protected.

In addition, the polysiloxane may be, as an example, a hydrolysis condensate of hydrolyzable silanes, or may be a modified product in which at least a part of silanol groups of the hydrolysis condensate is alcohol-modified or acetal-protected (hereinafter, may be referred to as a "modified product of a hydrolysis condensate"). The hydrolyzable silane related to the hydrolysis condensate may include one or two or more hydrolyzable silanes.

The polysiloxane may have a structure having any of a cage type, ladder type, linear type, and branched type main chain. Further, commercially available polysiloxanes may be used.

Note that the "hydrolysis condensate" of the hydrolyzable silane, that is, the product of the hydrolysis condensation includes not only a polyorganosiloxane polymer that is a condensate in which the condensation is completely completed but also a polyorganosiloxane polymer that is a partial hydrolysis condensate in which the condensation is not completely completed. Such a partial hydrolysis condensate is also a polymer obtained by hydrolysis and condensation of a hydrolyzable silane similarly to a condensate in which condensation is completely completed, but the polymer is partially hydrolyzed and is not condensed, and therefore, a Si—OH group remains.

Examples of the polysiloxane include a hydrolysis condensate of hydrolyzable silanes containing at least one hydrolyzable silane represented by the following Formula (1) or a modified product thereof.

[Chem. 6]
<<Formula (1)>>

(1)

In Formula (1), $R^1$ is a group bonded to a silicon atom, and independently represents an optionally substituted alkyl group, an optionally substituted aryl group, an optionally substituted aralkyl group, an optionally substituted halogenated alkyl group, an optionally substituted halogenated aryl group, an optionally substituted halogenated aralkyl group, an optionally substituted alkoxyalkyl group, an optionally substituted alkoxyaryl group, an optionally substituted alkoxyaralkyl group, or an optionally substituted alkenyl group, or represents an organic group having an epoxy group, an organic group having an acryloyl group, an organic group having a methacryloyl group, an organic group having a mercapto group, an organic group having an amino group, an organic group having an alkoxy group, an organic group having a sulfonyl group, or an organic group having a cyano group, or a combination of two or more thereof.

In addition, $R^2$ is a group or atom bonded to a silicon atom, and independently represents an alkoxy group, an aralkyloxy group, an acyloxy group, or a halogen atom.

a represents an integer of 0 to 3.

(1-7-2: Specific examples of hydrolyzable silane represented by Formula (1))

Specific examples of the hydrolyzable silane represented by Formula (1) include, but are not limited to, tetramethoxysilane, tetrachlorosilane, tetraacetoxysilane, tetraethoxysilane, tetra-n-propoxysilane, tetra-i-propoxysilane, tetra-n-butoxysilane, methyltrimethoxysilane, methyltrichorosilane, methyltriacetoxysilane, methyltriethoxysilane, methyltrippropoxysilane, methyltributoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl) methyltriethoxysilane, β-(3,4-epoxycyclohexyl) ethyltrimethoxysilane, β-(3,4-epoxycyclohexyl) ethyltriethoxysilane, β-(3,4-epoxycyclohexyl) ethyltripropoxysilane, β-(3,4-epoxycyclohexyl) ethyltributoxysilane, β-(3,4-epoxycyclohexyl) ethyltriphenoxysilane, γ-(3,4-epoxycyclohexyl) propyltrimethoxysilane, γ-(3,4-epoxycyclohexyl) propyltriethoxysilane, δ-(3,4-epoxycyclohexyl) butyltrimethoxysilane, δ-(3,4-epoxycyclohexyl) butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysiane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltriethoxysilane, vinyltrichlorosilane, vinyltriacetoxysilane, methylvinyldimethoxysilane, methylvinyldiethoxysilane, methylvinyldichlorosilane, methylvinyldiacetoxysilane, dimethylvinylmethoxysilane, dimethylvinylethoxysilane, dimethylvinylchlorosilane, dimethylvinylacetoxysilane, divinyldimethoxysilane, divinyldiethoxysilane, divinyldichlorosilane, divinyldiacetoxysilane, γ-glycidoxypropylvinyldimethoxysilane, γ-glycidoxypropylvinyldiethoxysilane, allyltrimethoxysilane, allyltriethoxysilane, allyltrichlorosilane, allyltriacetoxysilane, allylmethyldimethoxysilane, allylmethyldiethoxysilane, allylmethyldichlorosilane, allylmethyldiacetoxysilane, allyldimethylmethoxysilane, allyldimethylethoxysilane, allyldimethylchlorosilane, allyldimethylacetoxysilane, diallyldimethoxysilane, diallyldiethoxysilane, diallyldichlorosilane, diallyldiacetoxysilane, 3-allylaminopropyltrimethoxysilane, 3-allylaminopropyltriethoxysilane, p-styryltrimethoxysilane, phenyltrimethoxysilane, phenyltriethoxysilane, phenyltrichlorosilane, phenyltriacetoxysilane, phenylmethyldimethoxysilane, phenylmethyldiethoxysilane, phenylmethyldichlorosilane, phenylmethyldiacetoxysilane, phenyldimethylmethoxysilane, phenyldimethylethoxysilane, phenyldimethylchlorosilane, phenyldimethylacetoxysilane, diphenylmethylmethoxysilane, diphenylmethylethoxysilane, diphenylmethylchlorosilane, diphenylmethylacetoxysilane, diphenyldimethoxysilane, diphenyldiethoxysilane, diphenyldichlorosilane, diphenyldiacetoxysilane, triphenylmethoxysilane, triphenylethoxysilane, triphenylacetoxysilane, triphenylchlorosilane, 3-phenylaminopropyltrimethoxysilane, 3-phenylaminopropyltriethoxysilane, dimethoxymethyl-3-(3-phenoxypropylthiopropyl)silane, triethoxy((2-methoxy-4-(methoxymethyl)phenoxy)methyl)silane, benzyltrimethoxysilane, benzyltriethoxysilane, benzylmethyldimethoxysilane, benzylmethyldiethoxysilane, benzyldimethylmethoxysilane, benzyldimethylethoxysilane, benzyldimethylchlorosilane, phenethyltrimethoxysilane, phenethyltriethoxysilane, phenethyltrichlorosilane, phenethyltriacetoxysilane, phenethylmethyldimethoxysilane, phenethylmethyldiethoxysilane, phenethylmethyldichlorosilane, phenethylmethyldiacetoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysilane, methoxybenzyltrichlorosilane, methoxyphenethyltrimethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltrichlorosilane, ethoxybenzyltrimethoxysilane, ethoxybenzyltriethoxysilane, ethoxybenzyltriacetoxysilane, ethoxybenzyltrichlorosilane, i-propoxyphenyltrimethoxysilane, i-propoxyphenyltriethoxysilane, i-propoxyphenyltriacetoxysilane, i-propoxyphenyltrichlorosilane, i-propoxybenzyltrimethoxysilane, i-propoxybenzyltriethoxysilane, i-propoxybenzyltriacetoxysilane, i-propoxybenzyltrichlorosilane, t-butoxyphenyltrimethoxysilane, t-butoxyphenyltriethoxysilane, t-butoxyphenyl triacetoxysilane, t-butoxyphenyl trichlorosilane, t-butoxybenzyl trimethoxysilane, t-butoxybenzyl triethoxysilane, t-butoxybenzyl triacetoxysilane, t-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, thiocyanatopropyltriethoxysilane, chloromethyltrimethoxysilane, chloromethyltriethoxysilane, triethoxysilylpropyldiallylisocyanurate, bicyclo[2,2,1]heptenyltriethoxysilane, benzenesulfonylpropyltriethoxysilane, benzenesulfonamidopropyltriethoxysilane, dimethylaminopropyltrimethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, and methylvinyldiethoxysilane.

(1-8: Other Optional Components)

Moreover, the photocurable resin composition according to one embodiment of the present invention can contain, as necessary, a radical polymerization initiator (photopolymerization initiator or the like), an acid (catalyst), a thermal acid generator, a photoacid generator, a base (catalyst), a thermal base generator, a photobase generator, an antioxidant, a polymerization inhibitor, a crosslinking agent (polyfunctional acrylic or the like), an adhesion improver, an adhesion aid (silane coupling agent), a surfactant, an antifoaming agent, a rheology modifier, a pigment, a dye, a storage stabilizer, a dissolution accelerator such as a polyhydric phenol or a polyhydric carboxylic acid, a sensitizer, and the like.

However, because the self-crosslinkable polymer (A) contained in the photocurable resin composition according to one embodiment of the present invention is self-crosslinkable, it is not essential to add a photopolymerization initiator at least for curing the self-crosslinkable polymer (A).

(1-8-1: Radical Polymerization Initiator)

The radical polymerization initiator may be any initiator as long as it can release a substance that initiates radical polymerization by light irradiation and/or heating. Examples of a photoradical polymerization initiator include a benzophenone derivative, an imidazole derivative, a bisimidazole derivative, an N-arylglycine derivative, an organic azide compound, a titanocene compound, an aluminate complex, an organic peroxide, an N-alkylpyridinium salt, and a thioxanthone derivative. More specifically, examples thereof include, but are not limited to, benzophenone, 1,3-di(tert-butyldioxycarbonyl)benzophenone, 3,3',4,4'-tetrakis(tert-butyldioxycarbonyl)benzophenone, 3-phenyl-5-isoxazolone, 2-mercaptobenzimidazole, bis(2,4,5-triphenyl)imidazole, 2,2-dimethoxy-1,2-diphenylethan-1-one, 1-hydroxycyclohexylphenyl ketone, 2-benzyl-2-dimethylamino-1-(4-morpholinophenyl)-butan-1-one, and bis($\eta^5$-2,4-cyclopentadien-1-yl)-bis(2,6-difluoro-3-(1H-pyrrol-1-yl)-phenyl)titanium).

As the photoradical polymerization initiator, a commercially available product may also be used, and examples thereof include IRGACURE (registered trademark) 651, 184, 369, and 784 manufactured by BASF SE. In addition, specific examples of the commercially available product include IRGACURE (registered trademark) 500, 907, 379, 819, 127, 500, 754, 250, 1800, 1870, and OXE01, and DAROCUR (registered trademark) TPO and 1173 manufactured by BASF SE; Speedcure (registered trademark) MBB, PBZ, ITX, CTX, and EDB manufactured by Lambson Ltd.; Esacure (registered trademark) ONE, KIP150, and KTO46 manufactured by Lamberti S.p.A.; and KAYACURE (registered trademark) DETX-S, CTX, BMS, and DMBI manufactured by Nippon Kayaku Co., Ltd.

In addition, examples of a thermal radical polymerization initiator include, but are not limited to, a peroxide such as acetyl peroxide, benzoyl peroxide, methyl ethyl ketone peroxide, cyclohexanone peroxide, hydrogen peroxide, tert-butyl hydroperoxide, cumene hydroperoxide, di-tert-butyl peroxide, dicumyl peroxide, dilauroyl peroxide, tert-butyl peroxy acetate, tert-butyl peroxy pivalate, or tert-butyl peroxy-2-ethylhexanoate; an azo compound such as 2,2'-azobisisobutyronitrile, 2,2'-azobis(2,4-dimethylvaleronitrile), (1-phenylethyl)azodiphenylmethane, 2,2'-azobis(4-methoxy-2,4-dimethylvaleronitrile), dimethyl-2,2'-azobisisobutyrate, 2,2'-azobis(2-methylbutyronitrile), 1,1'-azobis (1-cyclohexanecarbonitrile), 2-(carbamoylazo) isobutyronitrile, 2,2'-azobis(2,4,4-trimethylpentane), 2-phenylazo-2,4-dimethyl-4-methoxyvaleronitrile, or 2,2'-azobis(2-methylpropane); and a persulfate such as ammonium persulfate, sodium persulfate, or potassium persulfate.

Examples of the commercially available thermal radical polymerization initiator include, but are not limited to, PERLOYL (registered trademark) IB, NPP, IPP, SBP, TCP, OPP, SA, 355, and L, PERBUTYL (registered trademark) ND, NHP, MA, PV, 355, A, C, D, E, L, I, O, P, and Z, PERHEXYL (registered trademark) ND, PV, D, I, O, and Z, PEROCTA (registered trademark) ND, NYPER (registered trademark) PMB, BMT, and BW, PERTETRA (registered trademark) A, PERHEXA (registered trademark) MC, TMH, HC, 250, 25B, C, 25Z, 22, and V, PEROCTA (registered trademark) 0, PERCUMYL (registered trademark) ND and D, PERMENTA (registered trademark) H, and NOFMER (registered trademark) BC manufactured by NOF CORPORATION; V-70, V-65, V-59, V-40, V-30, VA-044, VA-046B, VA-061, V-50, VA-057, VA-086, VF-096, VAm-110, V-601, and V-501 manufactured by Wako Pure Chemical Industries, Ltd.; IRGACURE (registered trademark) 184, 369, 651, 500, 819, 907, 784, 2959, CGI1700, CGI1750, CGI1850, and CG24-61, DAROCUR (registered trademark) 1116 and 1173, and LUCIRIN (registered trademark) TPO manufactured by BASF SE; UVECRYL (registered trademark) P36 manufactured by Cytec Surface Specialties S.A.; and Esacure (registered trademark) KIP150, KIP65LT, KIP100F, KT37, KT55, KTO46, and KIP75/B manufactured by Lamberti S.p.A.

The radical polymerization initiators may be used each alone or in combination of two or more thereof. A content of the radical polymerization initiator is preferably 1 part by mass or more, 2 parts by mass or more, 3 parts by mass or more, 50 parts by mass or less, 20 parts by mass or less, or 10 parts by mass or less, relative to 100 parts by mass of the polymer or compound having a crosslinkable group.

(1-8-2: Polymerization inhibitor)

As the polymerization inhibitor, a hindered phenol compound may be used, and specific examples thereof include 2,6-diisobutylphenol, 3,5-di-t-butylphenol, 3,5-di-t-butylcresol, hydroquinone, hydroquinone monomethyl ether, N-nitroso-N-phenylhydroxyamine aluminum, pyrogallol, t-butylcatechol, 4-methoxy-1-naphthol, 2,6-di-t-butyl-4-methylphenol, 2,5-di-t-butyl-hydroquinone, octadecyl-3-(3, 5-di-t-butyl-4-hydroxyphenyl)propionate, isooctyl-3-(3,5-di-t-butyl)-4-hydroxyphenyl)propionate, 4,4'-methylenebis (2,6-di-t-butylphenol), 4,4'-thio-bis(3-methyl-6-t-butylphenol), 4,4'-butylidene-bis(3-methyl-6-t-butylphenol), triethylene glycol-bis[3-(3-t-butyl-5-methyl-4-hydroxyphenyl)propionate], 1,6-hexanediol-bis[3-(3,5-di-t-butyl-4)-hydroxyphenyl)propionate], 2,2-thiodiethylenebis[3-(3,5-di-t-butyl-4-hydroxyphenyl) propionate], N,N'-hexamethylenebis(3,5-di-t-butyl-4-hydroxy-hydrocinnamamide), 2,2'-methylene-bis(4-methyl-6-t-butylphenol), 2,2'-methylene-bis(4-ethyl-6-t-butylphenol), pentaerythrityl-tetrakis[3-(3,5-di-t-butyl-4-hydroxyphenyl)propionate], tris-(3,5-di-t-butyl-4-hydroxybenzyl)-isocyanurate, 1,3,5-trimethyl-2,4,6-tris(3, 5-di-t-butyl-4-hydroxybenzyl)benzene, 1,3,5-tris(3-hydroxy-2,6-dimethyl-4-isopropylbenzyl)-1,3,5-triazine-2, 4,6-(1H,3H,5H)-t rione, 1,3,5-tris(4-t-butyl-3-hydroxy-2,6-dimethylbenzyl)-1,3,5-triazine-2,4,6-(1H,3H,5H)-trio ne, 1,3,5-tris(4-s-butyl-3-hydroxy-2,6-dimethylbenzyl)-1,3,5-triazine-2,4,6-(1H,3H,5H)-trio ne, 1,3,5-tris[4-(1-ethylpropyl)-3-hydroxy-2,6-dimethylbenzyl]-1,3,5-triazine-2,4,6-(1H,3H,5H)-trione, 1,3,5-tris[4-triethylmethyl-3-hydroxy-2, 6-dimethylbenzyl]-1,3,5-triazine-2,4,6-(1H,3H, 5H)-trione, 1,3,5-tris(3-hydroxy-2,6-dimethyl-4-phenylbenzyl)-1,3,5-triazine-2,4,6-(1H,3H,5H)-trio ne, 1,3,5-tris(4-t-butyl-3-hydroxy-2,5,6-trimethylbenzyl)-1,3,5-triazine-2,4,6-(1H,3H, 5H)-tr ione, 1,3,5-tris(4-t-butyl-5-ethyl-3-hydroxy-2,6-dimethylbenzyl)-1,3,5-triazine-2,4,6-(1H,3H, 5H)-trione, 1,3,5-tris(4-t-butyl-6-ethyl-3-hydroxy-2-methylbenzyl)-1,3, 5-triazine-2,4,6-(1H,3H,5H)-trione, 1,3,5-tris(4-t-butyl-6-ethyl-3-hydroxy-2,5-dimethylbenzyl)-1,3,5-triazine-2,4,6-(1H,3H, 5H)-trione, 1,3,5-tris(4-t-butyl-5,6-diethyl-3-hydroxy-2-methylbenzyl)-1,3,5-triazine-2,4,6-(1H,3H, 5H)-trione, 1,3,5-tris(4-t-butyl-3-hydroxy-2-methylbenzyl)-1,3, 5-triazine-2,4,6-(1H,3H,5H)-trione, 1,3,5-tris(4-t-butyl-3-hydroxy-2,5-dimethylbenzyl)-1,3,5-triazine-2,4,6-(1H,3H, 5H)-trio ne, and 1,3,5-tris(4-t-butyl-5-ethyl-3-hydroxy-2-methylbenzyl)-1,3,5-triazine-2,4,6-(1H,3H,5H)-trione.

Of the hindered phenol compounds, 1,3,5-tris(4-t-butyl-3-hydroxy-2,6-dimethylbenzyl)-1,3,5-triazine-2,4,6-(1H, 3H,5H)-trio ne is preferable.

As the polymerization inhibitor, a commercially available product may be used, and specific examples thereof include Irganox-3114 (manufactured by BASF Japan Ltd.).

The polymerization inhibitors may be used each alone or in combination of two or more thereof. A content of the polymerization inhibitor is preferably 0.01 to 1 part by mass, and more preferably 0.01 to 0.5 parts by mass, relative to 100 parts by mass of the total amount of the self-crosslinkable polymer (A) and the optionally contained crosslinkable polymer or crosslinkable compound (C).

(1-8-3: Surfactant)

Examples of the surfactant include a polyoxyethylene alkyl ether compound such as polyoxyethylene lauryl ether, polyoxyethylene stearyl ether, or polyoxyethylene oleyl ether, a polyoxyethylene alkyl allyl ether compound such as polyoxyethylene octyl phenol ether or polyoxyethylene nonyl phenol ether, a polyoxyethylene-polyoxypropylene block copolymer compound, a sorbitan fatty acid ester compound such as sorbitan monolaurate, sorbitan monopalmitate, sorbitan monostearate, sorbitan trioleate, or sorbitan tristearate, and a polyoxyethylene sorbitan fatty acid ester compound such as polyoxyethylene sorbitan monolaurate, polyoxyethylene sorbitan monopalmitate, polyoxyethylene sorbitan monostearate, or polyoxyethylene sorbitan tristearate. In addition, examples thereof include fluorine-based surfactants such as EFTOP EF301, EF303, and EF352 (trade name) (manufactured by Tochem Products Inc.), MEGAFACE F171, F173, R-08, and R-30 (trade name) (manufactured by DIC Corporation), FLUORAD FC430 and FC431 (manufactured by Sumitomo 3M Ltd.), and AsahiGuard AG710 and SURFLON S-382, SC101, SC102, SC103, SC104, SC105, and SC106 (trade name) (manufactured by AGC Inc.) and Organosiloxane Polymer-KP341 (manufactured by Shin-Etsu Chemical Co., Ltd.).

The surfactants may be used each alone or in combination of two or more thereof. A content of the surfactant is preferably 0.1 parts by mass or more, 0.5 parts by mass or more, 5 parts by mass or less, or 2 parts by mass or less, relative to 100 parts by mass of the total amount of the self-crosslinkable polymer (A) and the optionally contained crosslinkable polymer or crosslinkable compound.

(1-8-4: Other Components Such as Acid-Base Catalyst)

As an acid catalyst or a base catalyst, an acidic compound, a basic compound, or various compounds that generate an acid or a base by heat or light may be used.

As the acidic compound, a sulfonic acid compound or a carboxylic acid compound may be used.

Examples of the sulfonic acid compound or the carboxylic acid compound include p-toluenesulfonic acid, trifluoromethanesulfonic acid, pyridinium trifluoromethanesulfonate (=pyridinium trifluoromethanesulfonic acid), pyridinium-p-toluenesulfonate, pyridinium-4-hydroxybenzene sulfonate, salicylic acid, camphorsulfonic acid, 5-sulfosalicylic acid, 4-chlorobenzenesulfonic acid, 4-phenolsulfonic acid, pyridinium-4-phenolsulfonate, benzenedisulfonic acid, 1-naphthalenesulfonic acid, 4-nitrobenzenesulfonic acid, citric acid, benzoic acid, and hydroxybenzoic acid.

As the basic compound, an amine compound or an ammonium hydroxide compound may be used, and as the compound that generates a base by heat, urea may be used.

Examples of the amine compound include tertiary amines such as triethanolamine, tributanolamine, trimethylamine, triethylamine, tri-n-propylamine, tri-isopropylamine, tri-n-butylamine, tri-tert-butylamine, tri-n-octylamine, tri-isopropanolamine, phenyldiethanolamine, stearyldiethanolamine, and diazabicyclooctane, and aromatic amines such as pyridine and 4-dimethylaminopyridine. In addition, examples of the amine compound include primary amines such as benzylamine and n-butylamine, and secondary amines such as diethylamine and di-n-butylamine.

Examples of the ammonium hydroxide compound include tetramethylammonium hydroxide, tetraethylammonium hydroxide, tetrapropylammonium hydroxide, tetrabutylammonium hydroxide, betnyltrimethylammonium hydroxide, benzyltriethylammonium hydroxide, cetyltrimethylammonium hydroxide, phenyltrimethylammonium hydroxide, and phenyltriethylammonium hydroxide.

As the acid generator, both a thermal acid generator and a photoacid generator may be used.

Examples of the thermal acid generator include sulfonic acid compounds such as p-toluenesulfonic acid, trifluoromethanesulfonic acid, pyridinium p-toluenesulfonate (pyridinium p-toluenesulfonic acid), pyridinium p-hydroxybenzenesulfonic acid (p-phenolsulfonic acid pyridinium salt), pyridinium-trifluoromethanesulfonic acid, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid, and carboxylic acid compounds.

Examples of the commercially available product include K-PURE [registered trademark] CXC-1612, K-PURE CXC-1614, K-PURE TAG-2172, K-PURE TAG-2179, K-PURE TAG-2678, and K-PURE TAG2689 (manufactured by King Industries, Inc.) and SI-45, SI-60, SI-80, SI-100, SI-110, and SI-150 (manufactured by SANSHIN CHEMICAL INDUSTRY CO., LTD.).

Examples of the photoacid generator include a sulfonium salt, an iodonium salt, sulfonyl diazomethane, N-sulfonyloxyimide, a benzoinsulfonate photoacid generator, a pyrogallol trisulfonate photoacid generator, a sulfone photoacid generator, a glyoxime derivative photoacid generator, an oxime-O-sulfonate acid generator, and a bisoxime sulfonate acid generator. Examples thereof include bis(4-tert-butylphenyl)iodonium trifluoromethanesulfonate, triphenylsulfonium trifluoromethanesulfonate, phenyl-bis(trichloromethyl)-s-triazine, benzoin tosylate, and N-hydroxysuccinimide trifluoromethanesulfonate.

Examples of the thermal base generator include carbamates such as 1-methyl-1-(4-biphenylyl)ethyl carbamate and 2-cyano-1,1-dimethylethyl carbamate; ureas such as urea and N,N-dimethyl-N'-methylurea; guanidines such as guanidine trichloroacetate, guanidine phenylsulfonylacetate, and guanidine phenylpropiolate; dihydropyridines such as 1,4-dihydronicotinamide; dimethylpiperidines such as N-(isopropoxycarbonyl)-2,6-dimethylpiperidine, N-(tert-butoxycarbonyl)-2,6-dimethylpiperidine, and N-(benzyloxycarbonyl)-2,6-dimethylpiperidine; quaternized ammonium salts such as tetramethylammonium phenylsulfonylacetate and tetramethylammonium phenylpropiolate; and dicyandiamide. In addition, examples thereof include U-CAT (registered trademark) SA810, SA831, SA841, and SA851 [manufactured by San-Apro Ltd.], which are salts of 1,8-diazabicyclo[5.4.0]undec-7-ene (DBU).

Examples of the photobase generator include an alkylamine-based photobase generator such as 9-anthrylmethyl-N,N-diethyl carbamate; a cycloalkylamine-based photobase generator such as 9-anthryl-N,N-dicyclohexyl carbamate, 1-(9,10-anthraquinone-2-yl)ethyl-N,N-dicyclohexyl carbamate, dicyclohexylammonium-2-(3-benzoylphenyl)propionate, 9-anthryl-N-cyclohexylcarbamate, 1-(9,10-anthraquinone-2-yl)ethyl-N-cyclohexyl carbamate, cyclohexylammonium-2-(3-benzoylphenyl) propionate, or (E)-N-cyclohexyl-3-(2-hydroxyphenyl)acrylamide; a piperidine-based photobase generator such as 9-anthrylmethyl=piperidine-1-carboxylate, (E)-1-piperidino-3-(2-hydroxyphenyl)-2-propen-1-one, or (2-nitrophenyl)methyl-4-hydroxypiperidine-1-carboxylate, (2-nitrophenyl)methyl-4-(methacryloyloxy)piperidine-1-carboxylate; a guanidine-based photobase generator such as guanidinium=2-(3-benzoylphenyl)propionate, 1,2-diisopropyl-3-(bis(dimethylamino)methylene)guanidinium=2-(3-benzoylphenyl)propionate, 1,2-dicyclohexyl-4,4,5,5-tetramethylbiguanidium-n-butyltriphenylborate, or 1,5,7-triazabicyclo[4.4.0]dec-5-enium-2-(9-oxoxanthene-2-yl) propionate; and an imidazole-based photobase generator such as 1-(9,10-anthraquinone-2-yl)ethyl-imidazole-1-carboxylate.

The above components may be used each alone or in combination of two or more thereof, and in this case, the components are usually used in a blending amount of 10% by mass or less and preferably 3% by mass or less in a solid content of the photocurable resin composition of the present application.

<2. Protective Film [6]/Wafer for Manufacturing Semiconductor [10]>

(2-1: Protective Film [6])

A protective film [6] according to one embodiment of the present invention is a cured product of a coating film formed of the wafer edge protective film-forming composition [5] for manufacturing a semiconductor.

Since the protective film is excellent in etching resistance, the protective film is useful for preventing metal contamination of the wafer edge in semiconductor manufacturing.

In addition, a thickness of the protective film may be, for example, within the range of 1 to 500 nm, and a light having a wavelength of, for example, within the range of 170 to 800 nm may be used for photocuring.

(2-2: Wafer for Manufacturing Semiconductor [10])

A wafer for manufacturing a semiconductor according to one embodiment of the present invention is a wafer for manufacturing a semiconductor in which a wafer edge is protected, formed by applying the protective film-forming composition [5](see <1. Photocurable resin composition [1]/wafer edge protective film-forming composition for manufacturing semiconductor [5]>) according to one embodiment of the present invention to the wafer edge.
<3. Regarding Method for Manufacturing Semiconductor Device [11]>

A method for manufacturing a semiconductor device according to one embodiment of the present invention comprises the steps of:

(A) forming a resist film on a semiconductor substrate;
(B) forming a resist pattern by irradiation of the resist film with a light or electron beam and subsequent development; and
(C) processing the semiconductor substrate by etching or processing the semiconductor substrate by etching through the patterned resist, wherein the method includes step (X) of forming a protective film formed of the protective film-forming composition [5] according to one embodiment of the present invention on a front surface edge and optionally on a bevel portion and/or back surface edge of a wafer for manufacturing a semiconductor.

Hereinafter, the method will be described in order.

(3-1: Step (A) of Forming Resist Film on Semiconductor Substrate)

A resist film is formed on a semiconductor substrate. The semiconductor substrate is a wafer used for manufacturing a semiconductor element or the like, and in addition to a generally used silicon wafer and germanium wafer, for example, a compound semiconductor wafer formed by bonding two or more elements such as gallium arsenide, indium phosphide, gallium nitride, indium nitride, and aluminum nitride may be used. The semiconductor substrate usually has a disk shape, and a size thereof is, for example, 4, 6, 8, or 12 inches, or the like. A commercially available product may be used.

In a case where a semiconductor substrate having a front surface on which an inorganic film is formed is used, the inorganic film is formed by, for example, an atomic layer deposition (ALD) method, a chemical vapor deposition (CVD) method, a reactive sputtering method, an ion-plating method, a vacuum deposition method, or a spin coating method (spin on glass: SOG). Examples of the inorganic film include a polysilicon film, a silicon oxide film, a silicon nitride film, a Boro-Phospho Silicate Glass (BPSG) film, a titanium nitride film, a titanium nitride oxide film, a tungsten film, a gallium nitride film, and a gallium arsenide film.

On such a semiconductor substrate, a resist underlayer film, a resist film, and the like having predetermined thicknesses are formed by an appropriate application method such as a spray, a spinner, or a coater. In general, in a case of a rotary coating method, each of the resist underlayer film-forming composition, the resist film-forming composition, and the like is supplied from above the central portion of the rotating disk-shaped substrate through a nozzle or the like. Usually, these films are baked using a heating means such as a hot plate.

A photoresist used for forming a resist film is not particularly limited as long as it is sensitive to the light used for exposure. Either a negative photoresist or a positive photoresist may be used. Examples of the photoresist include a positive photoresist formed of a novolac resin and 1,2-naphthoquinonediazide sulfonic acid ester; a chemically amplified photoresist formed of a binder having a group degradable by an acid to increase an alkali dissolution rate and a photoacid generator; a chemically amplified photoresist formed of a low-molecular-weight compound degradable by an acid to increase an alkali dissolution rate of the photoresist, an alkali-soluble binder, and a photoacid generator; a chemically amplified photoresist formed of a binder having a group degradable by an acid to increase an alkali dissolution rate, a low-molecular-weight compound degradable by an acid to increase an alkali dissolution rate of the photoresist, and a photoacid generator; and a resist containing metal elements. Examples thereof include V146G (trade name) manufactured by JSR Corporation, APEX-E (trade name) manufactured by Shipley Company L.L.C, PAR710 (trade name) manufactured by Sumitomo Chemical Co., Ltd., and AR2772 and SEPR430 (trade name) manufactured by Shin-Etsu Chemical Co., Ltd. In addition, examples thereof include a fluorine-containing atomic polymer-based photoresist as described in Proc. SPIE, Vol. 3999, 330-334 (2000), Proc. SPIE, Vol. 3999, 357-364 (2000), and Proc. SPIE, Vol. 3999, 365-374 (2000). A negative photoresist is preferable.

The resist film-forming composition used for forming the resist film may contain one or more metals. Examples of the form of the metal include a metal salt, a metal complex, and other metal-containing compounds in addition to a simple metal. The kind of the metal is not particularly limited, and examples thereof include tin, indium, antimony, bismuth, gallium, germanium, aluminum, zirconium, hafnium, cerium, lanthanum, and cesium.

The conditions for baking the resist film are appropriately selected from a bake temperature of 70° C. to 400° C. and a bake time of 0.3 minutes to 60 minutes. Preferably, the bake temperature is 80° C. to 350° C. and the bake time is 0.5 minutes to 30 minutes, and more preferably, the bake temperature is 90° C. to 300° C. and the bake time is 0.8 minutes to 10 minutes.

The lower limit of an average thickness of the resist film is preferably 1 nm and more preferably 3 nm, 5 nm, or 10 nm. The upper limit of the average thickness of the resist film is 5,000 nm, 3,000 nm, or 2,000 nm, preferably 1,000 nm, more preferably 200 nm, and more preferably 50 nm.

(3-2: Step (X) of forming protective film, and optional steps (Y) and (Z))

(3-2-1: Step X)

Step (X) of forming the protective film formed of the protective film-forming composition [5] according to one embodiment of the present invention on the front surface edge and optionally on the bevel portion and/or back surface edge of the wafer for manufacturing a semiconductor is performed at an arbitrary time point. In step (X), as a preferred procedure, the protective film-forming composition is applied and then exposed and developed on a predetermined region. Step (X) may be performed before step (A), may be performed between step (A) and step (B) or after may be performed after step (B) or after step (C).

Note that, in the present specification, a surface of a substrate on which a device portion such as a resist film is provided is referred to as a front surface, and a surface on the opposite side is referred to as a back surface. In addition, the front surface edge refers to a region having a width of usually 1 to 10 mm from an edge of the device portion provided on the substrate to the bevel portion, the bevel portion refers to a curved region connecting the front surface edge and the back surface edge, and the back surface edge refers to a region of the back surface of the substrate opposite to the front surface edge.

First, the protective film-forming composition [5](see <1. Photocurable resin composition [1]/wafer edge protective film-forming composition for manufacturing semiconductor

[5]>) according to one embodiment of the present invention is applied to a semiconductor substrate on which a resist film or the like has been formed. A method for applying the protective film-forming composition is not particularly limited, and for example, a known means such as a rotary coating method (spin coating method) or a spraying method may be adopted. For example, when a rotary coating method is adopted, the protective film-forming composition is supplied through a nozzle from above or near the front surface edge of a rotating disk-shaped substrate while rotating the semiconductor substrate on which a resist film and the like are formed at a predetermined rotation speed. Preferably, the bevel portion and/or back surface edge of the substrate is also supplied from the vicinity of each of the bevel portion and the back surface edge through a nozzle.

The conditions for the rotary coating may be appropriately selected, and are not limited at all, but typical conditions are as follows.

Viscosity of protective film-forming composition: about 100 cps or less
Rotation speed of wafer:
At time of supplying protective film-forming composition: 50 to 500 rpm
At time of shaking off for drying: 700 to 2,000 rpm
Thickness of protective film: 300 nm Next, the protective film-forming composition is exposed. The exposure may be performed by irradiating the protective film-forming composition with an active ray (an i-ray, a KrF excimer laser, an ArF excimer laser, extreme ultraviolet (EUV), or an electron beam (EB)) such as an ultraviolet ray, a visible ray, or a radiation through a mask or without a mask. Note that soft bake (SB) may be performed before exposure, or post-exposure bake (PEB) may be performed before development after exposure. A post-exposure bake temperature is preferably 50° C. to 150° C., and a post-exposure bake time is preferably 1 minute to 10 minutes.

Next, the protective film-forming composition after exposure is developed. The development may be performed by removing an exposed portion of the protective film-forming composition after exposure with a developer, and a development temperature and a development time are appropriately selected from 5° C. to 50° C. and 10 seconds to 300 seconds, respectively.

Examples of an organic solvent contained in the developer include an alcohol-based solvent, an ether-based solvent, a ketone-based solvent, an amide-based solvent, an ester-based solvent, and a hydrocarbon-based solvent. As the organic solvent in the developer, an ester-based solvent, a ketone-based solvent, or a combination thereof is preferably contained. The developer may contain one organic solvent only or two or more organic solvents.

Examples of the alcohol-based solvent include an aliphatic monoalcohol-based solvent having 1 to 18 carbon atoms such as 4-methyl-2-pentanol or n-hexanol; an alicyclic monoalcohol-based solvent having 3 to 18 carbon atoms such as cyclohexanol; and a polyhydric alcohol partial ether-based solvent having 3 to 19 carbon atoms such as propylene glycol monomethyl ether.

Examples of the ether-based solvent include a dialkyl ether-based solvent such as diethyl ether, dipropyl ether, dibutyl ether, dipentyl ether, diisoamyl ether, dihexyl ether, or diheptyl ether; a cyclic ether-based solvent such as tetrahydrofuran or tetrahydropyran; and an aromatic ring-containing ether-based solvent such as diphenyl ether or anisole.

Examples of the ketone-based solvent include a linear ketone-based solvent such as acetone, methyl ethyl ketone, methyl-n-propyl ketone, methyl-n-butyl ketone, diethyl ketone, methyl-iso-butyl ketone, 2-heptanone, ethyl-n-butyl ketone, methyl-n-hexyl ketone, di-iso-butyl ketone, or trimethylnonanone; a cyclic ketone-based solvent such as cyclopentanone, cyclohexanone, cycloheptanone, cyclooctanone, or methylcyclohexanone; and 2,4-pentanedione, acetonylacetone, and acetophenone.

Examples of the amide-based solvent include a cyclic amide-based solvent such as N,N'-dimethylimidazolidinone or N-methylpyrrolidone; and a chain amide-based solvent such as N-methylformamide, N,N-dimethylformamide, N,N-diethylformamide, acetamide, N-methylacetamide, N,N-dimethylacetamide, or N-methylpropionamide.

Examples of the ester-based solvent include a monocarboxylic acid ester-based solvent such as n-butyl acetate or ethyl lactate; a polyhydric alcohol carboxylate-based solvent such as propylene glycol acetate; a polyhydric alcohol partial ether carboxylate-based solvent such as propylene glycol monomethyl ether acetate; a polyhydric carboxylic acid diester-based solvent such as diethyl oxalate; and a carbonate-based solvent such as dimethyl carbonate or diethyl carbonate.

Examples of the hydrocarbon-based solvent include an aliphatic hydrocarbon-based solvent having 5 to 12 carbon atoms such as n-pentane or n-hexane; and an aromatic hydrocarbon-based solvent having 6 to 16 carbon atoms such as toluene or xylene.

Of these, an ester-based solvent, a ketone-based solvent, an ether-based solvent, and a combination thereof are preferable, and an ester-based solvent, a ketone-based solvent, and a combination thereof are more preferable. As the ester-based solvent, propylene glycol monomethyl ether acetate is preferable. As the ketone-based solvent, cyclohexanone is preferable. As the ether-based solvent, propylene glycol monomethyl ether is preferable.

The lower limit of the content of the organic solvent in the developer is preferably 80% by mass, more preferably 90% by mass, still more preferably 99% by mass, and particularly preferably 100% by mass. When the content of the organic solvent in the developer is within the above range, the dissolution contrast between the exposed portion and the unexposed portion may be improved, and as a result, a resist pattern having more excellent lithography performance may be formed. Examples of components different from the organic solvent include water and silicone oil.

The developer may contain a nitrogen-containing compound. When the developer contains the nitrogen-containing compound, film loss in the formed resist pattern may be further reduced.

As the developer, a developer of an aqueous solution may be used instead of the organic solvent-based developer. Specifically, the developer may be an aqueous alkali solution such as sodium hydroxide, potassium hydroxide, sodium silicate, ammonia, monoethylamine, diethylamine, triethylamine, triethanolamine, or tetramethylammonium hydroxide. The base concentration of these aqueous solutions is not particularly limited, and may be, for example, within the range of 0.1 to 10% by weight.

In addition, alcohols or a surfactant may be added to the developer. Each of the alcohols or surfactants may be blended preferably within the range of 0.01 to 10 parts by weight and more preferably 0.1 to 5 parts by weight relative to 100 parts by weight of the developer. Examples of the surfactant include an ionic or nonionic fluorine-based surfactant and a silicone-based surfactant.

Examples of the developing method include a method in which a substrate is immersed in a tank filled with a developer for a certain period of time (dipping method), a method in which a developer is heaped up on a front surface of a substrate by surface tension and is stopped for a certain period of time (paddle method), a method in which a developer is sprayed onto a front surface of a substrate (spraying method), and a method in which a developer is continuously applied onto a substrate rotating at a certain speed while a developer application nozzle is scanned at a certain speed (dynamic dispensing method).

Next, the developed protective film-forming composition is baked. A desired pattern may be formed by baking the pattern obtained after development. A heating temperature in the heat treatment is usually 150° C. or higher and 350° C. or lower, and preferably within the range of 200 to 300° C. A heat treatment time is a time until the protective film-forming composition is cured, and is preferably about shorter than 30 minutes in consideration of productivity.

The lower limit of an average thickness of the protective film is preferably 1 nm and more preferably 3 nm. The upper limit of the average thickness of the protective film is preferably 500 nm and more preferably 300 nm.

(3-2-2: Steps Y and Z)

After step (X), in step (Y), the resist film formed on the protective film may be removed with a removing solution. In this case, as in step (X), it is preferable to apply the removing solution to the front surface edge and optionally the bevel portion and/or back surface edge of the wafer for manufacturing a semiconductor. Examples of the resist removing solution include a mixed solution formed of propylene glycol monomethyl ether, propylene glycol monomethyl ether acetate, cyclohexanone, water, butyl acetate, a tetramethylammonium aqueous solution, or a combination thereof. Of these, propylene glycol monomethyl ether acetate and water are preferable from the viewpoint of removability of the resist film.

After step (X) or step (Y), in step (Z), the protective film may be removed by ashing or by a treatment with hydrofluoric acid, an organic solvent, an alkaline developer, or a semiconductor cleaning solution. Thereafter, cleaning is preferably performed with an arbitrary solvent, a conventional semiconductor cleaning solution, or the like.

Steps (X), (Y), and (Z) may be performed simultaneously with steps (A), (B), and (C), or at any time before and after each of the steps. For example, in a case where step (X) is included before step (A), step (Y) of removing the resist film formed on the protective film may be performed between step (A) and step (B), and step (Z) of removing the protective film may be performed between step (Y) and step (B). In addition, in a case where step (X) is included between step (A) and step (B) or after step (C), step (Z) of removing the protective film may be performed between step (X) and step (B) or after step (C).

(3-3: Step (B) of Forming Resist Pattern by Irradiation of Resist Film with Light or Electron Beam and Subsequent Development and Step (C) of Processing Semiconductor Substrate by Etching)

(3-3-1: Exposure in Step (B))

The exposure of the resist film is performed through a mask (reticle) for forming a predetermined pattern, and for example, an i-ray, a KrF energy laser, an ArF energy laser, an extreme ultraviolet ray (EUV), or an electron beam (EB) is used. Note that soft bake (SB) may be performed before exposure, or post-exposure bake (PEB) may be performed before development after exposure. A post-exposure bake temperature is preferably within the range of 50° C. to 150° C., and a post-exposure bake time is preferably within the range of 1 minute to 10 minutes.

(3-3-2: Development in Step (B))

In the development, an alkaline developer is used, and a development temperature and a development time are appropriately selected from 5° C. to 50° C. and 10 seconds to 300 seconds, respectively. As the alkaline developer, for example, aqueous solutions of alkalis, for example, inorganic alkalis such as sodium hydroxide, potassium hydroxide, sodium carbonate, sodium silicate, sodium metasilicate, and ammonia water, primary amines such as ethylamine and n-propylamine, secondary amines such as diethylamine and di-n-butyl amine, tertiary amines such as triethylamine and methyldiethylamine, alcoholamines such as dimethylethanolamine and triethanolamine, quaternary ammonium salts such as tetramethylammonium hydroxide, tetraethylammonium hydroxide, and choline, and cyclic amines such as pyrrole and piperidine, may be used. The base concentration of these aqueous solutions is not particularly limited, and may be, for example, within the range of 0.1 to 10% by weight.

Moreover, an appropriate amount of alcohols such as isopropyl alcohol and a surfactant such as a nonionic surfactant may be added to the aqueous solution of alkalis. Each of the alcohols or surfactant may be blended within the range of preferably 0.01 to parts by weight and more preferably 0.1 to 5 parts by weight relative to 100 parts by weight of the developer. Of these, a preferred developer is a quaternary ammonium salt and more preferably tetramethylammonium hydroxide and choline. Furthermore, a surfactant or the like may be added to the developer.

A method of performing development using an organic solvent such as a polyhydric alcohol-based solvent having 2 to 18 carbon atoms such as 1,2-propylene glycol or butyl acetate instead of the alkaline developer, and developing the portion where the alkali dissolution rate of the photoresist is not increased may also be used.

(3-3-3: Baking in Step (B))

Step (B) may include a step of baking the semiconductor substrate subjected to the exposure and development. A means for baking is not particularly limited, and for example, a proximity bake furnace for securing a gap using a plurality of substrate support pins between a substrate and a hot plate is suitably used.

The bake temperature is usually within the range of 40° C. to 300° C. and preferably 200 to 300° C. for 1 to 30 minutes, and may be set to 90° C. or lower in a case where it is required to avoid damage to the resist pattern.

The baking may be performed on the semiconductor substrate before the post-exposure development. The means and conditions of the baking are as described above, and may be set to 90° C. or lower when it is required to avoid damage to the resist pattern.

(3-3-4: Etching in Step (C))

Next, the resist underlayer film is etched and preferably dry-etched using the formed resist pattern as a mask, to form a patterned resist. At this time, in a case where an inorganic film is formed on the surface of the semiconductor substrate used, the surface of the inorganic film is exposed; and in a case where no inorganic film is formed on the surface of the semiconductor substrate used, the surface of the semiconductor substrate is exposed. Thereafter, the semiconductor substrate is processed using the patterned resist by a method known per se (dry etching method or the like).

The etching for processing the semiconductor substrate may be a known method. For example, in a case where the semiconductor substrate is a silicon substrate, the etching also includes a surface treatment step such as removing a silicon nitride film present on a front surface of the semiconductor substrate with thermal phosphoric acid in addition to a step of performing shape processing by dry etching using a fluorine-based gas such as carbon tetrafluoride.

<4. Regarding method for manufacturing wafer for manufacturing semiconductor [21]>

(4-1)

A method for manufacturing a wafer for manufacturing a semiconductor according to one embodiment of the present invention includes the step of applying the wafer edge protective film-forming composition for manufacturing a semiconductor [10] according to one embodiment of the present invention to a front surface edge and optionally a bevel portion and/or back surface edge of a wafer precursor for manufacturing a semiconductor to manufacture a wafer for manufacturing semiconductor with a protective film in the method for manufacturing a semiconductor device as described above.

Here, the wafer precursor for manufacturing a semiconductor refers to a precursor obtained by subjecting a semiconductor substrate to at least one step of the method for manufacturing a semiconductor device. For example, it refers to, in the method for manufacturing a semiconductor device as described above, a material that is undergone the steps of forming an inorganic film, a resist underlayer film, a resist film, and the like on a semiconductor substrate and is used for the step of forming a resist pattern by irradiation of the resist film with a light or electron beam and subsequent development.

(4-2: Specific Mode of Method for Manufacturing Wafer for Manufacturing Semiconductor)

The wafer edge protective film-forming composition for manufacturing a semiconductor [5] according to one embodiment of the present invention is applied, by spin coating, to a front surface edge and optionally a bevel portion and/or back surface edge of a wafer precursor for manufacturing a semiconductor obtained by one or more steps of the semiconductor device manufacturing process.

Thereafter, the semiconductor substrate may be baked. In this case, a means for baking is not particularly limited, and for example, a proximity bake furnace for securing a gap using a plurality of substrate support pins between a substrate and a hot plate is suitably used. A bake temperature is usually 40° C. to 300° C. and preferably 200 to 300° C. for 1 to 30 minutes.

After the protective film-forming composition is applied, the protective film edge surface may be subjected to a known treatment in the semiconductor manufacturing process such as edge bead removal or back rinsing.

EXAMPLES

Synthesis Example 1

1 g of 4-benzoylphenyl methacrylate, 10.3 g of 2-hydroxypropyl methacrylate, and 0.2 g of 2,2'-azobis(methyl isobutyrate) were dissolved in 29.5 g of ethyl lactate and 12.6 g of propylene glycol monomethyl ether acetate. Thereafter, the temperature thereof was raised to 80° C., and a reaction was allowed to occur for 24 hours, thereby obtaining a copolymer solution of 4-benzoylphenyl methacrylate and 2-hydroxypropyl methacrylate containing repeating units of the following Formulas (I) and (II).

[Chem. 7]

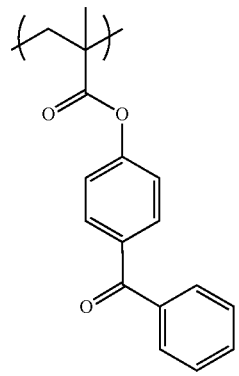

(I)

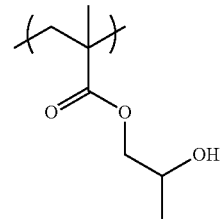

(II)

GPC analysis showed that the obtained copolymer had a weight average molecular weight of 35,000 in terms of standard polystyrene.

Synthesis Example 2

1.5 g of 4-benzoylphenyl methacrylate, 1.6 g of 2-hydroxypropyl methacrylate, 10 g of styrene, and 0.3 g of 2,2'-azobis(methyl isobutyrate) were dissolved in 37.5 g of ethyl lactate and 16.1 g of propylene glycol monomethyl ether acetate. Thereafter, the temperature thereof was raised to 80° C., and a reaction was allowed to occur for 24 hours, thereby obtaining a copolymer solution of 4-benzoylphenyl methacrylate, 2-hydroxypropyl methacrylate, and styrene containing repeating units of the following Formulas (I) to (III).

[Chem. 8]

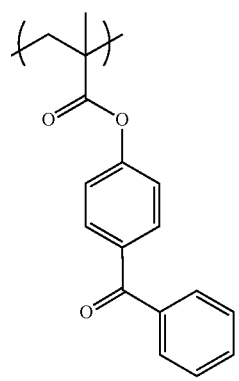

(I)

-continued

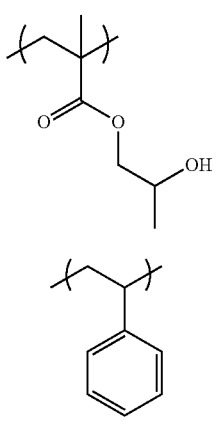

(II)

(III)

The obtained polymer solution was subjected to reprecipitation in methanol, and then dried in a vacuum oven to obtain a white polymer. GPC analysis showed that the obtained polymer had a weight average molecular weight of 34,000 in terms of standard polystyrene.

Synthesis Example 3

10 g of 2-hydroxypropyl methacrylate and 0.2 g of 2,2'-azobis(methyl isobutyrate) were dissolved in 28.9 g of ethyl lactate and 12.2 g of propylene glycol monomethyl ether acetate. Thereafter, the temperature thereof was raised to 80° C., and a reaction was allowed to occur for 24 hours, thereby obtaining a polymer solution of 2-hydroxypropyl methacrylate containing a repeating unit of the following Formula (II).

[Chem. 9]

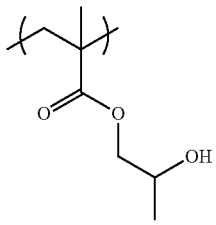

(II)

GPC analysis showed that the obtained copolymer had a weight average molecular weight of 35,000 in terms of standard polystyrene.

Synthesis Example 4

101.11 g of propylene glycol monomethyl ether acetate was added to 30.00 g of an epoxy group-containing novolac resin (product name: EPPN-201, epoxy value: 192 g/eq., manufactured by Nippon Kayaku Co., Ltd.), 11.26 g of acrylic acid, 1.99 g of tetrabutylphosphonium bromide, and 0.09 g of hydroquinone. The resultant solution was heated while stirring at 100° C. for 18 hours under a nitrogen atmosphere. To this solution were added 43 g of an anion exchange resin (trade name: AMBERJET [registered trademark] ESG4002(OH), ORGANO CORPORATION) and 43 g of a cation exchange resin (trade name: AMBERLITE [registered trademark]15JWET, ORGANO CORPORA- TION). The solution was then subjected to an ion exchange treatment at room temperature for 4 hours. Separation of the ion exchange resins therefrom gave a solution of a compound, which corresponded to a polymer containing a repeating unit of Formula (XX):

[Chem. 10]

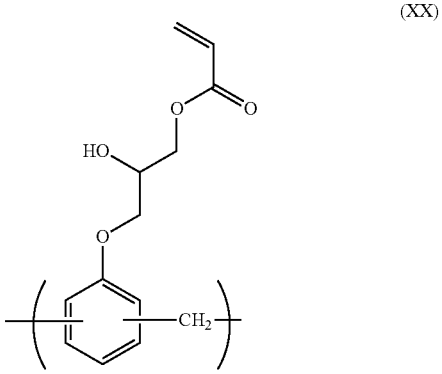

(XX)

GPC analysis showed that the polymer had a weight average molecular weight Mw of 6,900 measured in terms of polystyrene.

<b. Preparation of Composition>
<Composition 1>

To 8 g of the reaction product obtained in Synthesis Example 1 were added 4.5 g of ethyl lactate and 1.9 g of propylene glycol monomethyl ether acetate. Filtration of the resultant mixture with a polyethylene microfilter having a pore size of 0.10 μm gave a photocurable resin composition solution.

<Composition 2>

To 4 g of the reaction product obtained in Synthesis Example 2 was added 16 g of propylene glycol monomethyl ether acetate. Filtration of the resultant mixture with a polyethylene microfilter having a pore size of 0.10 μm gave a photocurable resin composition solution.

Comparative Example 1

To 8 g of the reaction product obtained in Synthesis Example 3 were added 4.5 g of ethyl lactate and 1.9 g of propylene glycol monomethyl ether acetate. Filtration of the resultant mixture with a polyethylene microfilter having a pore size of 0.10 μm gave a photocurable resin composition solution.

Comparative Example 2

To 11.72 g of the resin solution (solid content: 23.73% by mass) obtained in Synthesis Example 4 were added 0.28 g of Irgacure Oxe01 (manufactured by BASF Japan Ltd.) as a photopolymerization initiator, 0.008 g of MEGAFACE R-30 (manufactured by DIC Corporation) as a surfactant, 0.042 g of Irganox 3114 (manufactured by BASF Japan Ltd.) as an antioxidant, 0.042 of KBM-5103 (manufactured by Shin-Etsu Chemical Co., Ltd.) as an adhesion improver, and 17.91 g of propylene glycol monomethyl ether acetate. Filtration of the resultant mixture gave a photocurable resin composition solution.

<c. Test for Elution into Photoresist Solvent>

Each of the photocurable resin composition solutions prepared in Composition Examples 1 and 2 and Comparative Example 1 was applied onto a silicon wafer by a spinner. The applied composition was baked on a hot plate at 80° C. for 1 minute, and then irradiated with a light having a wavelength of 254 nm at 300 mJ/cm² by an aligner (PLA-501, Canon Inc.) to form a photocured film (film thickness: 0.10 μm). The photocured film was immersed in cyclohexanone, which is a solvent used in a photoresist. It was confirmed that the films of Composition Examples 1 and 2 were insoluble in the solvent, but the film of Comparative Example 1 was dissolved by the solvent.

<d. Solvent Resistance Test in Edge Exposure>

Each of the photocurable resin composition solutions prepared in Composition Examples 1 and 2 and Comparative Example 1 was applied onto a 12 inch silicon wafer by a spinner. The applied composition was baked on a hot plate at 80° C. for 1 minute, and then the wafer edge was irradiated at 50 mJ/cm² by WEE of Lithiuspro (Tokyo Electron Limited.) to form a photocured film (film thickness: 0.30 μm). The photocured film was immersed in OK73 thinner, which is a solvent used for a photoresist. It was confirmed that the films of Composition Examples 1 and 2 were insoluble in the solvent, but the film of Comparative Example 1 was dissolved by the solvent.

<Measurement of Dry Etching Rate>

Each of the photocurable resin composition solutions prepared in Composition Example 2 and Comparative Example 2 was applied onto a silicon wafer by a spinner. Thereafter, the applied composition was irradiated with a light having a wavelength of 254 nm at 300 mJ/cm² by an aligner (PLA-501, Canon Inc.) to form a photocured film (film thickness: 0.10 μm). Then, the dry etching rate (the amount of decrease in film thickness per unit time) was measured using RIE system (RIE-10NR) manufactured by SAMCO Inc. under the condition of using $CF_4$ as a dry etching gas.

The dry etching rate of the photocurable resin formed in Composition Example 2 was compared with that of the resin formed in Comparative Example 2. The table shows the result. In Table 1, the etching rate is shown when the dry etching rate of Comparative Example 2 is taken as 1.00.

TABLE 1

| Table 1 | |
|---|---|
| | Selection ratio |
| Composition Example 2 | 0.69 |
| Comparative Example 2 | 1.00 |

Thus, it is found that the photocured film obtained using the photocurable resin-forming composition according to one embodiment of the present invention has a high dry etching resistance as compared with Comparative Example 2.

The invention claimed is:

1. A wafer for manufacturing a semiconductor with a wafer edge protected, formed by applying a wafer edge protective film-forming composition for manufacturing a semiconductor, which comprises a photocurable resin composition comprising:

a self-crosslinkable polymer (A) containing:
(a) a first monomer unit containing an aryl ketone residue in a side chain; and
(b) a second monomer unit containing, in a side chain,
(b-1) an aliphatic hydrocarbon residue containing a carbon atom susceptible to a hydrogen abstraction reaction, and/or
(b-2) an aromatic ring residue; and
a solvent (B)
to an edge of a wafer precursor.

2. A method for manufacturing a semiconductor device, the method comprising the steps of:
(A) forming a resist film on a semiconductor substrate;
(B) forming a resist pattern by irradiation of the resist film with a light or electron beam and subsequent development; and
(C) processing the semiconductor substrate by etching,
wherein the method includes step (X) of forming a protective film of a wafer edge protective film-forming composition for manufacturing a semiconductor, which comprises a photocurable resin composition comprising:
a self-crosslinkable polymer (A) containing:
(a) a first monomer unit containing an aryl ketone residue in a side chain; and
(b) a second monomer unit containing, in a side chain,
(b-1) an aliphatic hydrocarbon residue containing a carbon atom susceptible to a hydrogen abstraction reaction, and/or
(b-2) an aromatic ring residue; and
a solvent (B)
on a front surface edge and optionally on a bevel portion and/or back surface edge of a wafer for manufacturing a semiconductor.

3. The method for manufacturing a semiconductor device according to claim 2, wherein the method includes step (X) before step (A).

4. The method for manufacturing a semiconductor device according to claim 2, wherein the method includes step (X) between step (A) and step (B).

5. The method for manufacturing a semiconductor device according to claim 2, wherein the method includes step (X) after step (B) or after step (C).

6. The method for manufacturing a semiconductor device according to claim 2, wherein the method includes, after step (X), step (Y) of removing the resist film formed on the protective film.

7. The method for manufacturing a semiconductor device according to claim 2, wherein the method includes, after step (X), step (Z) of removing the protective film.

8. The method for manufacturing a semiconductor device according to claim 6, wherein the method includes, after step (Y), step (Z) of removing the protective film.

9. The method for manufacturing a semiconductor device according to claim 2, wherein the resist film contains a metal.

10. The method for manufacturing a semiconductor device according to claim 2, wherein step (X) includes the step of conducting application of the wafer edge protective film-forming composition for manufacturing a semiconductor which comprises the photocurable resin composition, followed by exposure and development on a predetermined region.

11. The method for manufacturing a semiconductor device according to claim 7, wherein step (Z) is performed by ashing or by a treatment with hydrofluoric acid, an organic solvent, an alkaline developer, or a semiconductor cleaning solution.

12. A method for manufacturing a wafer for manufacturing a semiconductor, the method comprising the step of:
applying a wafer edge protective film-forming composition for manufacturing a semiconductor, which comprises a photocurable resin composition comprising:
a self-crosslinkable polymer (A) containing:
  (a) a first monomer unit containing an aryl ketone residue in a side chain; and
  (b) a second monomer unit containing, in a side chain,
  (b-1) an aliphatic hydrocarbon residue containing a carbon atom susceptible to a hydrogen abstraction reaction, and/or
  (b-2) an aromatic ring residue; and
a solvent (B)
to an edge of a wafer precursor to make a wafer having the protected edge.

* * * * *